United States Patent
Fornage et al.

(10) Patent No.: US 8,435,056 B2
(45) Date of Patent: May 7, 2013

(54) APPARATUS FOR COUPLING POWER GENERATED BY A PHOTOVOLTAIC MODULE TO AN OUTPUT

(75) Inventors: Martin Fornage, Petaluma, CA (US); Matthew K. Meeker, Santa Rosa, CA (US)

(73) Assignee: Enphase Energy, Inc., Petaluma, CA (US)

( * ) Notice: Subject to any disclaimer, the term of this patent is extended or adjusted under 35 U.S.C. 154(b) by 551 days.

(21) Appl. No.: 12/657,069

(22) Filed: Jan. 13, 2010

(65) Prior Publication Data

US 2010/0263704 A1   Oct. 21, 2010

Related U.S. Application Data (60) Provisional application No. 61/212,811, filed on Apr. 16, 2009.

(51) Int. Cl.
*H01R 13/62* (2006.01)

(52) U.S. Cl.
USPC .......................................... 439/153; 136/244

(58) Field of Classification Search .................. 439/153, 439/157, 160, 34, 535, 345, 76.1, 76.2, 159, 439/374; 136/244.251
See application file for complete search history.

(56) References Cited

U.S. PATENT DOCUMENTS

| | | | |
|---|---|---|---|
| 4,217,633 A | 8/1980 | Evans, Jr. | |
| 4,283,106 A | 8/1981 | Bunnell | |
| 4,310,211 A | 1/1982 | Bunnell et al. | |
| 4,460,232 A | 7/1984 | Sotolongo | |
| 5,280,133 A | 1/1994 | Nath | |
| 5,886,890 A | 3/1999 | Ishida et al. | |
| 5,951,785 A | 9/1999 | Uchihashi et al. | |
| 6,046,400 A | 4/2000 | Drummer | |
| 6,066,797 A | 5/2000 | Toyomura et al. | |
| 6,111,189 A | 8/2000 | Garvison et al. | |
| 6,201,180 B1 | 3/2001 | Meyer et al. | |
| 6,285,572 B1 | 9/2001 | Onizuka et al. | |
| 6,291,764 B1 | 9/2001 | Ishida et al. | |

(Continued)

FOREIGN PATENT DOCUMENTS

| | | |
|---|---|---|
| DE | 198 59 732 A1 | 6/2000 |
| EP | 0 793 278 A2 | 9/1997 |

(Continued)

OTHER PUBLICATIONS

Pending U.S. Appl. No. 61/270,809, "Method and System for Locating Stolen Solar Power System Components" filed Jul. 14, 2009, pp. 1-28.

(Continued)

*Primary Examiner* — Xuong Chung Trans
(74) *Attorney, Agent, or Firm* — Moser Taboada (57) ABSTRACT

Apparatus for coupling power generated by a photovoltaic (PV) module to an output. The apparatus comprises a universal connector assembly, comprising a connector housing, adapted for coupling to the PV module, comprising a DC connection assembly for coupling power from the PV module to a power module via a first plurality of connectors; and a base for supporting the power module spaced apart from the PV module in a manner that exposes at least a portion of the power module facing the PV module to the air and prevents air from being trapped between the power module and the PV module.

19 Claims, 10 Drawing Sheets

U.S. PATENT DOCUMENTS

| | | | |
|---|---|---|---|
| 6,344,612 | B1 | 2/2002 | Kuwahara et al. |
| 6,384,580 | B1 | 5/2002 | Ochoa et al. |
| 6,465,993 | B1 | 10/2002 | Clarkin et al. |
| 6,582,249 | B1 * | 6/2003 | Boeck et al. ............... 439/492 |
| 6,593,521 | B2 | 7/2003 | Kobayashi |
| 6,605,881 | B2 | 8/2003 | Takehara et al. |
| 6,713,890 | B2 | 3/2004 | Kondo et al. |
| 6,750,391 | B2 | 6/2004 | Bower et al. |
| 6,791,024 | B2 | 9/2004 | Toyomura |
| 6,838,611 | B2 | 1/2005 | Kondo et al. |
| 6,897,370 | B2 | 5/2005 | Kondo et al. |
| 7,291,036 | B1 | 11/2007 | Daily et al. |
| 7,297,866 | B2 | 11/2007 | Aschenbrenner |
| 7,342,171 | B2 | 3/2008 | Khouri et al. |
| 7,387,537 | B1 * | 6/2008 | Daily et al. ............ 439/620.22 |
| 7,406,800 | B2 | 8/2008 | Cinnamon et al. |
| 7,625,238 | B2 * | 12/2009 | Duesterhoeft ......... 439/620.22 |
| 7,850,476 | B2 * | 12/2010 | Good ........................ 439/358 |
| 7,862,383 | B2 * | 1/2011 | Cours et al. ............... 439/638 |
| 7,880,098 | B2 * | 2/2011 | Grimberg et al. ........... 174/547 |
| 8,113,853 | B2 * | 2/2012 | Coyle et al. ............... 439/76.1 |
| 2003/0111103 | A1 | 6/2003 | Bower et al. |
| 2003/0193322 | A1 | 10/2003 | Higashikozono et al. |
| 2004/0024494 | A1 | 2/2004 | Bayoumi et al. |
| 2004/0177987 | A1 | 9/2004 | Yoshikawa et al. |
| 2004/0261835 | A1 | 12/2004 | Utsunomiya et al. |
| 2005/0022859 | A1 | 2/2005 | Nass et al. |
| 2005/0054219 | A1 | 3/2005 | Werner et al. |
| 2005/0054244 | A1 | 3/2005 | Werner et al. |
| 2005/0116671 | A1 | 6/2005 | Minami et al. |
| 2005/0161080 | A1 | 7/2005 | Nieleck et al. |
| 2005/0172995 | A1 | 8/2005 | Rohrig et al. |
| 2005/0268958 | A1 | 12/2005 | Aoyama |
| 2006/0000504 | A1 | 1/2006 | Feldmeier et al. |
| 2006/0146504 | A1 | 7/2006 | Belson et al. |
| 2006/0180196 | A1 | 8/2006 | Lares et al. |
| 2006/0243318 | A1 | 11/2006 | Feldmeier et al. |
| 2006/0283628 | A1 | 12/2006 | Feldmeier et al. |
| 2006/0289053 | A1 | 12/2006 | Nieleck et al. |
| 2007/0252716 | A1 | 11/2007 | Burger |
| 2007/0295392 | A1 | 12/2007 | Cinnamon |
| 2007/0295393 | A1 | 12/2007 | Cinnamon |
| 2008/0011348 | A1 | 1/2008 | Aoyama et al. |
| 2008/0115822 | A1 | 5/2008 | Cunningham et al. |
| 2008/0115911 | A1 | 5/2008 | Duesterhoeft |
| 2008/0236886 | A1 | 10/2008 | Gerull et al. |
| 2008/0277161 | A1 | 11/2008 | Gherardini et al. |
| 2008/0283118 | A1 | 11/2008 | Rotzoll et al. |
| 2008/0305668 | A1 | 12/2008 | Wu |
| 2009/0084570 | A1 | 4/2009 | Gherardini et al. |

FOREIGN PATENT DOCUMENTS

| | | |
|---|---|---|
| EP | 0 855 750 A1 | 7/1998 |
| EP | 1 672 702 A1 | 6/2006 |
| EP | 1 998 378 A1 | 12/2008 |
| JP | 09-135571 | 5/1997 |
| JP | 2002-058152 | 2/2002 |
| JP | 2004-274088 | 9/2004 |
| JP | 2004-289181 | 10/2004 |
| JP | 2008-177078 | 7/2008 |
| WO | WO 00/30216 | 5/2000 |
| WO | WO 03/056680 A2 | 7/2003 |
| WO | WO 03/098703 A2 | 11/2003 |
| WO | WO 2004/006342 A1 | 1/2004 |
| WO | WO 2005/117136 A2 | 12/2005 |
| WO | WO 2007/140736 A1 | 12/2007 |
| WO | WO 2008/095670 A1 | 8/2008 |
| WO | WO 2008/108909 A1 | 9/2008 |
| WO | WO 2008/144554 A3 | 11/2008 |
| WO | WO 2005/117245 A1 | 12/2008 |
| WO | WO 2009/088977 A1 | 7/2009 |
| WO | WO 2010/091445 A1 | 8/2010 |

OTHER PUBLICATIONS

Pending U.S. Appl. No. 12/284,915, "Universal Interface for a Photovoltaic Module" filed Sep. 26, 2008, pp. 1-21.

Digi-Key Corporation, Tyco Electronics, "Solar Energy & SOLARLOK", pp. 1-18, downloaded Jun. 2, 2010 from website http://dkc1.digikey.com/us/en/tod/TycoElectronicsAMP/Solarlok/Solarlok.swf.

International Search Report and Written Opinion mailed Oct. 2, 2008 for PCT Application No. PCT/US2008/063937.

International Search Report and Written Opinion mailed Dec. 23, 2008 for PCT Application No. PCT/US2008/063965.

International Search Report and Written Opinion mailed Jan. 19, 2009 for PCT Application No. PCT/US2008/063958.

International Search Report and Written Opinion mailed Nov. 26, 2009 for PCT Application No. PCT/US2008/063965.

International Search Report and Written Opinion mailed Nov. 26, 2009 for PCT Application No. PCT/US2008/063937.

H. Oldenkamp et al., AC modules: past, present and future, Workshop Installing the solar solution, Jan. 22-23, 1998, Hatfield, UK.

C. Rodriguez et al., Long-Lifetime Power Inverter for Photovoltaic AC Modules, IEEE Transactions on Industrial Electronics, vol. 55, No. 7, Jul. 2008.

S. J. Strong et al., Development of Standardized, Low-Cost AC PV Systems, NREL/SR-520-23002, Jun. 1997.

S. J. Strong et al., Development of Standardized, Low-Cost AC PV Systems, NREL/SR-520-26084, Feb. 1999.

J. Hoffner et al., A PV Window Awning System on the University of Texas Houston Heal Science Center Using AC-Modules, 0-7803-5772-8-00, 2000.

M.C. Russell et al., Sunsine300 AC Module, Annual Report Jul. 25, 1995-Dec. 31, 1996, NREL/SR-520-23432, UC Category 1280.

G. Kern, Sunsine300: Manufacture of an AC Photovoltaic Module, Final Report, Phases I & II Jul. 25, 1995-Jun. 30, 1998, NREL/SR-520-26085.

W. Bower et al., Innovative PV Micro-Inverter Topology Eliminates Electrolytic Capacitors for Longer Lifetime, 1-4244-0016-3/06, 2006.

Examination Report for Canada Patent Application No. 2698046 dated Jun. 13, 2012; 2 pages.

* cited by examiner

APPARATUS FOR COUPLING POWER GENERATED BY A PHOTOVOLTAIC MODULE TO AN OUTPUT

CROSS-REFERENCE TO RELATED APPLICATIONS

This application claims benefit of U.S. provisional patent application Ser. No. 61/212,811, filed Apr. 16, 2009, which is herein incorporated in its entirety by reference.

BACKGROUND OF THE INVENTION

1. Field of the Invention

Embodiments of the present disclosure generally relate to inverters and, more particularly, to an apparatus for coupling an inverter to a photovoltaic module.

2. Description of the Related Art

Solar panels have historically been deployed in mostly remote applications, such as remote cabins in the wilderness or satellites, where commercial power was not available. Due to the high cost of installation, solar panels were not an economical choice for generating power unless no other power options were available. However, the worldwide growth of energy demand is leading to a durable increase in energy cost. In addition, it is now well established that the fossil energy reserves currently being used to generate electricity are rapidly being depleted. These growing impediments to conventional commercial power generation make solar panels a more attractive option to pursue.

Solar panels, or photovoltaic (PV) modules, convert energy from sunlight received into direct current (DC). The PV modules cannot store the electrical energy they produce, so the energy must either be dispersed to an energy storage system, such as a battery or pumped hydroelectricity storage, or dispersed by a load, for example by providing alternating current (AC) to business or residential buildings or coupling AC power to a commercial power grid. In some solar power systems that provide AC power, PV modules may be coupled to inverters that invert the DC current to AC current in a distributed architecture; i.e., one inverter per PV module. For such solar power systems, installation generally involves mechanically attaching the inverters to a rigid mounting rail, coupling each inverter to an individual PV module, and mechanically attaching the PV modules to the mounting rail. This installation process is complex as well as labor and time intensive.

Therefore, there is a need in the art for an apparatus to efficiently couple an inverter to a PV module.

SUMMARY OF THE INVENTION

Embodiments of the present invention generally relate to an apparatus for coupling power generated by a photovoltaic (PV) module to an output. The apparatus comprises a universal connector assembly, comprising a connector housing, adapted for coupling to the PV module, comprising a DC connection assembly for coupling power from the PV module to a power module via a first plurality of connectors; and a base for supporting the power module spaced apart from the PV module in a manner that exposes at least a portion of the power module facing the PV module to the air and prevents air from being trapped between the power module and the PV module.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
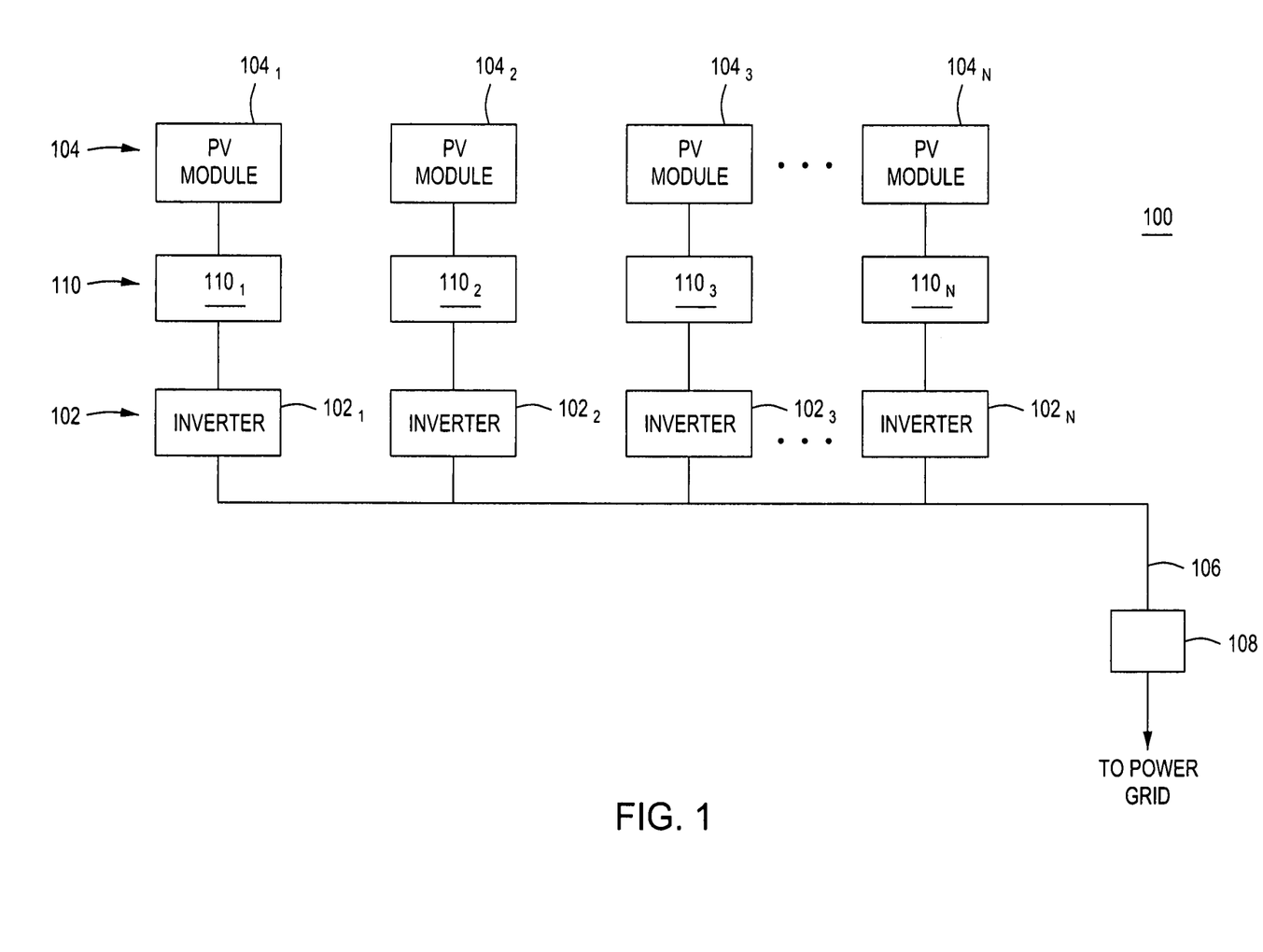
FIG. 1 is a block diagram of a system for inverting solar generated DC power to AC power in accordance with one or more embodiments of the present invention.

FIG. 1 is a block diagram of a photovoltaic (PV) system 100 for generating power in accordance with one or more embodiments of the present invention. This diagram only portrays one variation of the myriad of possible system configurations. The present invention can function in a variety of environments and systems.

The PV system 100 comprises a plurality of power modules $102_1, 102_2 \ldots 102_n$ (collectively power modules 102), a plurality of PV modules $104_1, 104_2 \ldots 104_n$ (collectively PV modules 104), and a plurality of universal connector assemblies $110_1, 110_2 \ldots 110_n$ (collectively PV modules 110). In some embodiments, such as the embodiment described herein, the power modules 102 are DC/AC inverters, referred to as inverters 102, for inverting DC power generated by the PV modules 104 to AC power (i.e., AC current). In other embodiments, the power modules 102 may be DC junction boxes or DC/DC converters.

In accordance with one or more embodiments of the present invention, each inverter $102_1, 102_2 \ldots 102_n$ is individually coupled to a PV module $104_1, 104_2 \ldots 104_n$, respectively, via a universal connector assembly $110_1, 110_2 \ldots 110_n$, respectively, in a one-to-one correspondence. The universal connector assemblies 110 mechanically mount the inverters 102 to the PV modules 104; in some embodiments, the universal connector assemblies 110 removably mount the inverters 102 to the PV modules 104 such that the inverters 102 may be removed from and/or coupled to the PV modules 104, for example, in a field environment. Additionally, the universal connector assemblies 110 may electrically couple the inverters 102 to the PV modules 104 for providing the DC power from the PV modules 104 to the inverters 102.

The inverters 102 are further coupled to an AC bus 106, which in turn is coupled to a load center 108, for providing the AC output power produced by the inverters 102. In some embodiments, the load center 108 houses connections between incoming power lines from a commercial power grid distribution system and the AC bus 106. In such embodiments, the inverters 102 meter out AC current that is in-phase with the AC commercial power grid voltage, and the system 100 couples the generated AC power to the commercial power grid via the load center 108. Additionally or alternatively, the generated AC power may be supplied directly to commercial and/or residential systems via the load center 108.

In some embodiments, a DC junction box may be coupled to each PV module 104 via a universal connector assembly 110 (i.e., one DC junction box per PV module 104) in addition to or in place of the inverters 102. Additionally or alternatively, a DC/DC converter may be coupled to each PV module 104 via a universal connector assembly 110 (i.e., one converter per universal connector assembly 110). The universal connector assemblies 110 thereby provide a standardized means for efficiently coupling any compatible power component, e.g., a DC junction box, a DC/DC converter, or a DC/AC inverter, to a PV module, thereby providing a modular plug-n-play system that facilitates flexible solar power system design and fabrication as well as maintenance and repair.

Figure 2:
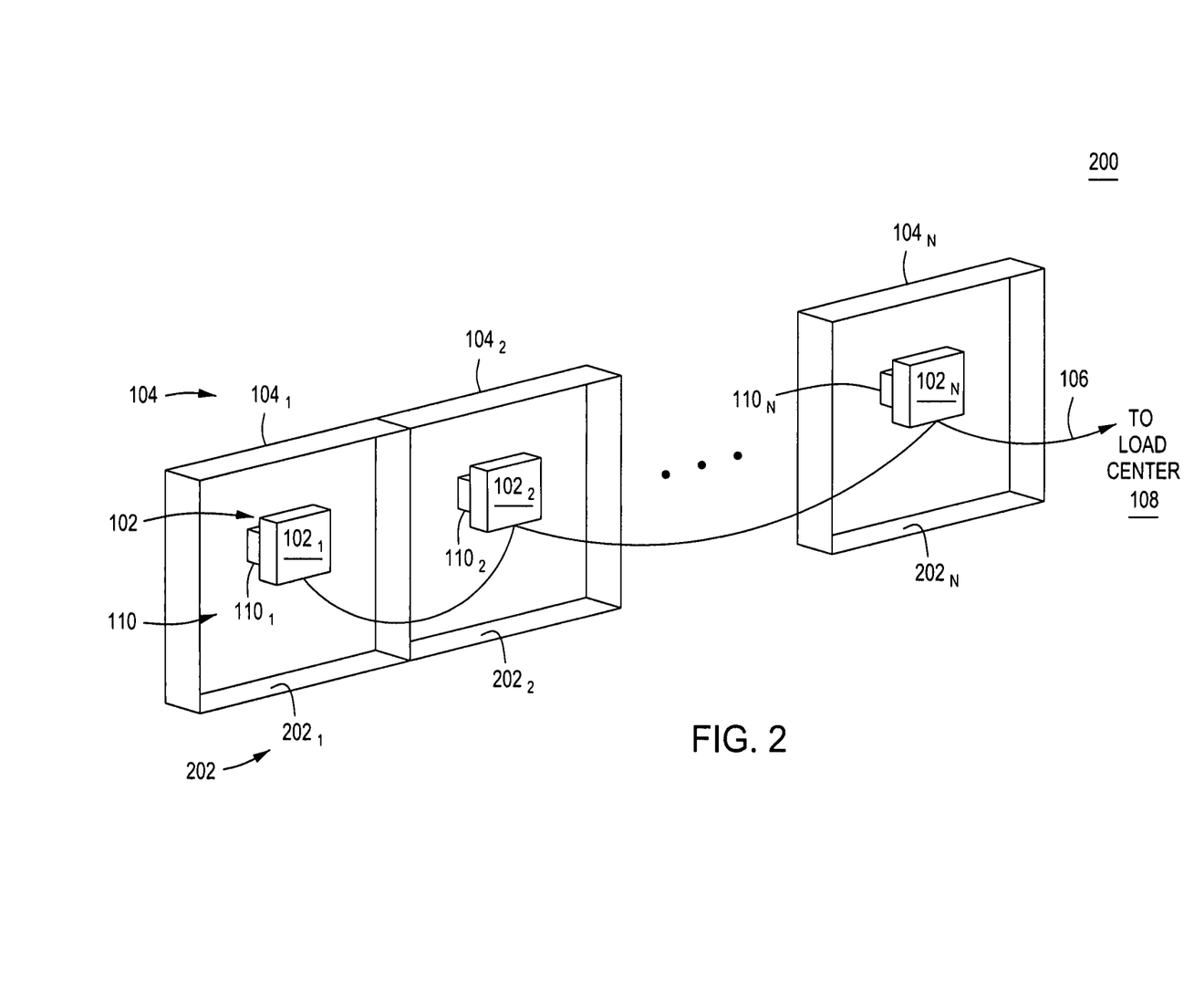
FIG. 2 is a block diagram depicting a physical layout of the system of FIG. 1 in accordance with one or more embodiments of the present invention.

FIG. 2 is a block diagram depicting a physical layout of the PV system 100 in accordance with one or more embodiments of the present invention. Each PV module $104_1, 104_2 \ldots 104_n$ comprises a structural frame $202_1, 202_2 \ldots 202_n$, respectively, collectively referred to as frames 202. Each of the frames 202 surrounds the perimeter of the corresponding PV module 104 and may be constructed of any rigid material, such as aluminum, rigid plastic, and the like, or any combination of such rigid materials. The frames 202 of the PV modules 104 are generally coupled flush with the frames 202 of neighboring PV modules 104 in a horizontal direction.

The inverters $102_1, 102_2 \ldots 102_n$ are coupled to the universal connector assemblies $110_1, 110_2 \ldots 110_n$, respectively, in a one-to-one correspondence, and the universal connector assemblies $110_1, 110_2 \ldots 110_n$ are further coupled to the PV modules $104_1, 104_2 \ldots 104_n$, also in a one-to-one correspondence. In accordance with one or more embodiments of the present invention, the universal connector assemblies 110 provide a mechanism for mechanically coupling (i.e., mounting) the inverters 102 to the PV modules 104; in some embodiments, such coupling may be performed in a removable fashion. The universal connector assemblies 110 secure the inverters 102 proximate (i.e., spaced apart from) the rear face of the PV modules 104 (i.e., the side to face away from the sun) such that each of the inverters 102 may be electrically coupled to the corresponding PV module 104 for inverting the generated DC power to AC power. In some embodiments, the universal connector assemblies 110 themselves provide the electrical connectivity between the inverters 102 and the PV modules 104. Additionally, a DC junction box may be coupled between each PV module 104 and each inverter 102 for providing DC connections between the PV module 104 and the corresponding inverter 102.

The AC power at the output of the inverters 102 is coupled to the AC bus 106 for providing such AC power to the load center 108 for further distribution.

Figure 3:
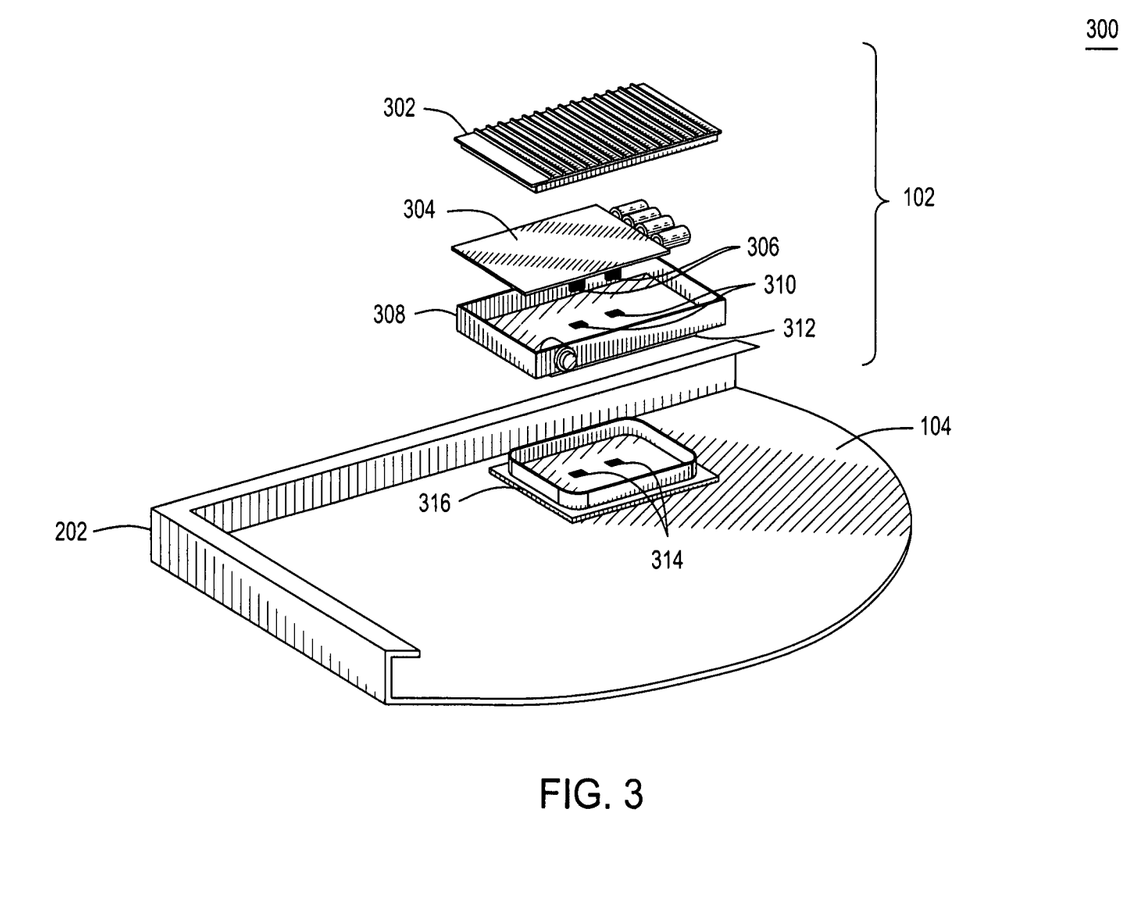
FIG. 3 depicts a perspective, exploded view of an assembly for mounting an inverter to a PV module in accordance with one or more embodiments of the present invention.

FIG. 3 depicts a perspective, exploded view of an assembly 300 for mounting an inverter 102 to a PV module 104 in accordance with one or more embodiments of the present invention. The PV module 104 comprises a set of two DC contacts 314 (i.e., a positive and a negative contact) for providing a DC current output from the PV module 104. The DC contacts 314 may consist of two exposed conductor ribbons (sometimes referred to as foil) from the PV module 104; alternatively, the DC contacts 314 may be part of an existing DC junction box of the PV module 104 or a DC/DC converter.

In some embodiments, such as the embodiment depicted in FIG. 3, the universal connector assembly 110 may be in the form of a retaining ring 316. The retaining ring 316 is a hollow supporting base comprising a flange that extends around at least a portion of the retaining ring perimeter for adhering the retaining ring 316 to the rear face of the PV module 104. The retaining ring 316 is of a size and shape, such as oval, round, square, rectangular, or the like, that can support the inverter 102 proximate but spaced apart from the PV module 104, and may be constructed of any rigid insulating material such as dielectric plastic or the like. The retaining ring 316 may be mounted to the PV module 104 by adhering the flange to the PV module rear face, for example by epoxy, bonding, VHB™ (Very High Bond) tape, or similar mechanical method, such that the DC contacts 314 are exposed within the perimeter of the retaining ring 316. The retaining ring 316 may be adhered to the PV module 104 by a mechanism that provides immediate secure adhesion, such as VHBT™ tape, and further sealed by an applied or dispensed adhesive or sealant such as epoxy or silicone, thereby allowing the integrated PV module 104/inverter 102 to be moved immediately following assembly without any wait time.

The inverter 102 is comprised of a casing 308, an inverter board 304, and a casing cover 302. The casing 308 and casing cover 302 may be constructed from any rigid material, such as metal, plastic, and the like, and house the inverter board 304 which comprises the inverter electronics. The casing cover 302 encloses the inverter board 304 within the casing 308 and may be secured to the casing 308 by one or more of screws, bolts, bonding adhesives, snap features, clips, or similar mechanical means. Additionally, one or more connectors may be provided as part of the inverter board 304 and/or the casing 308 for grounding and/or coupling the AC power from the inverter 102. In some embodiments, the casing cover 302 may comprise a heat sink, for example protruding combs, ribs, and/or fins that are part of the form factor of the casing cover 302; alternatively, the heat sink may be coupled to the casing cover 302.

The inverter board 304 comprises two conductive DC connectivity pins 306 consisting of a conductive material such as aluminum, copper, and the like, for coupling to the positive and negative DC contacts 314. The DC connectivity pins 306 protrude from the inverter board 304 and extend through one or more apertures in the casing 308, such as a set of two pin apertures 310. The DC connectivity pins 306 may utilize a spring-mechanism type of contact, such as a leaf spring, or similar resilient contact, for making contact with the DC contacts 314; alternatively, the DC connectivity pins 306 may be electrically coupled to the DC contacts 314 via a socketed contact.

The form factor of the casing 308 comprises a coupling surface 312 for coupling the casing 308 to the retaining ring 316; in alternative embodiments, the coupling surface 312 may be a separate component coupled to the casing 308. The coupling surface 312 is of a size and shape such that it mates with the retaining ring 316 and provides an environmental seal to protect the enclosed electrical connections (i.e., the electrical connections between the DC contacts 314 and the DC connectivity pins 306) from environmental factors and foreign matter. An O-ring may be utilized to provide an additional environmental seal, and/or the interior of the retaining ring 316 may be encapsulated (e.g., silicone filled) such that the DC contacts 314 remain accessible. The coupling surface 312 may be secured to the retaining ring 316 by a detachable mechanical method, such as one or more of snap features, clips, screws, rivets and the like; additionally and/or alternatively, the coupling surface 312 may be permanently secured to the retaining ring 316, for example by bonding adhesives.

The retaining ring 316 is of a size and shape such that the inverter 102 is retained a suitable distance from PV module 104 to provide a thermal barrier between the inverter 102 and the PV module 104. Such a thermal barrier reduces thermal contact between the inverter 102 and the PV module 104 and allows a uniform thermal profile to be maintained across temperature-sensitive PV cells of the PV module 104. Additionally, the retaining ring flange is of a size that minimizes thermal effects when adhered to the PV module 104. The retaining ring 316 may maintain the inverter 102 within the plane of the PV module frame 202; alternatively, the inverter 102 may be extended beyond the PV module frame plane.

Figure 4:
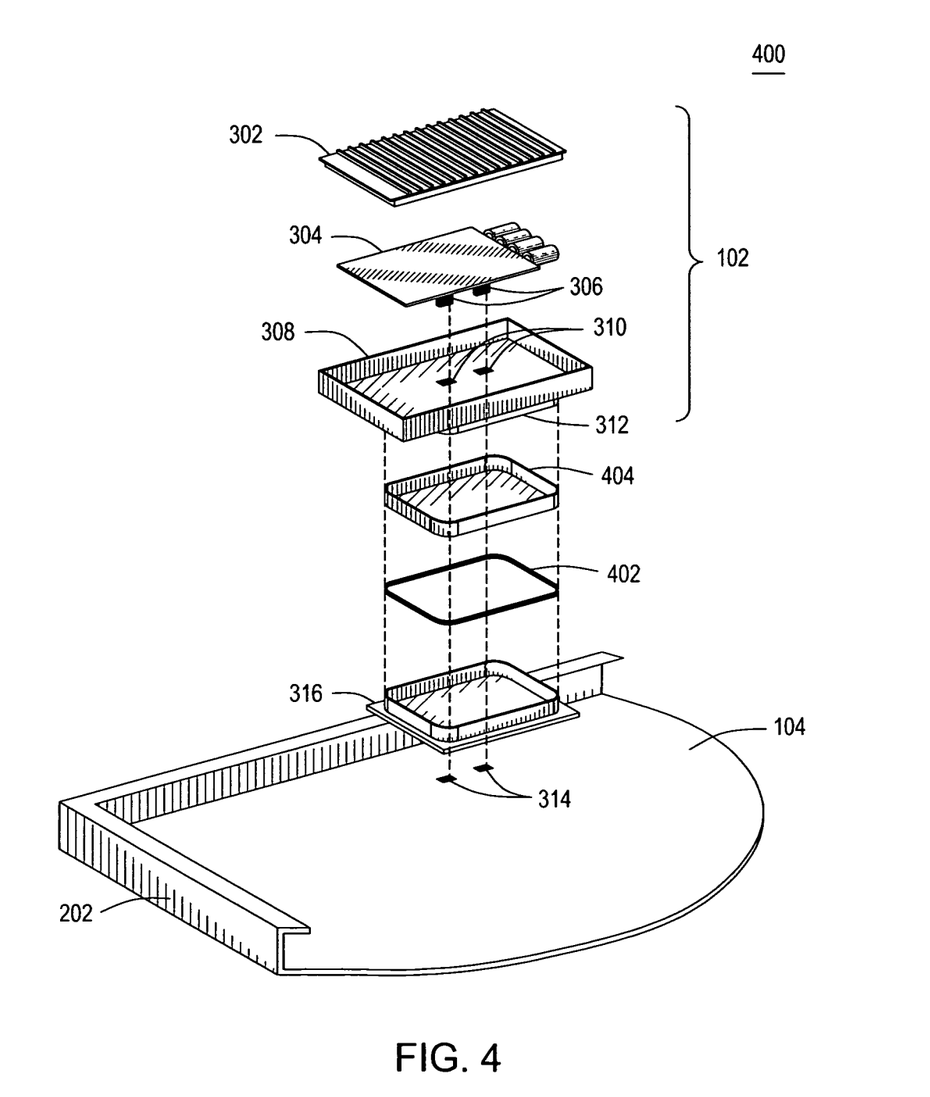
FIG. 4 is an exploded, close-up view of an assembly for mounting an inverter to a PV module in accordance with one or more embodiments of the present invention.

FIG. 4 is an exploded, close-up view of an assembly 400 for mounting an inverter 102 to a PV module 104 in accordance with one or more embodiments of the present invention. Within the assembly 400, the retaining ring 316 is adhered to the rear face of the PV module 104 by a method as previously described, such that the DC contacts 314 are exposed within the retaining ring perimeter. An O-ring 402 is aligned within the perimeter of the retaining ring 316 such that the DC contacts 314 remain exposed, and the O-ring 402 may be additionally secured by an adhesive, such as a silicone adhesive or a similar epoxy.

The coupling surface 312 of the casing 308 is coupled to the retaining ring 316, and the inverter board 304 is retained between the casing 308 and the casing cover 302 as previously described. The DC connectivity pins 306 of the inverter board 304 are aligned with and pass through the pin apertures 310 of the casing 312 and are electrically coupled to the DC contacts 314. In some embodiments, the DC connectivity pins 306 may make direct contact with the DC contacts 314, for example by a resilient contact, such as a spring-mechanism, or a socketed connection.

In some embodiments, an optional DC junction box 404 may be coupled between the inverter 102 and the PV module 104. The DC junction box 404 may be an existing component of the PV module 104 that presents the DC contacts 314 to the inverter 102. Alternatively, the DC junction box 404 may be retained between the retaining ring 316 and the inverter 102. In such embodiments, the DC junction box 404 may be coupled to the DC contacts 314 and present a separate set of DC contacts to the DC connectivity pins 306. Additionally, the DC junction box 404 may be removeably coupled to the retaining ring 316 by a mechanical means such as one or more of snap features, clips, screws, rivets and the like, and/or may be permanently adhered to the retaining ring 316 by means such as epoxy, bonding, and the like.

In embodiments where the inverter 102 is detachably coupled to the retaining ring 316, the retaining ring 316 allows the inverter 102 and the PV module 104 to be physically coupled/decoupled as needed, for example in a manufacturing environment and/or in a field environment, thereby facilitating flexible solar power system design and fabrication as well as maintenance and repair.

Figure 5:
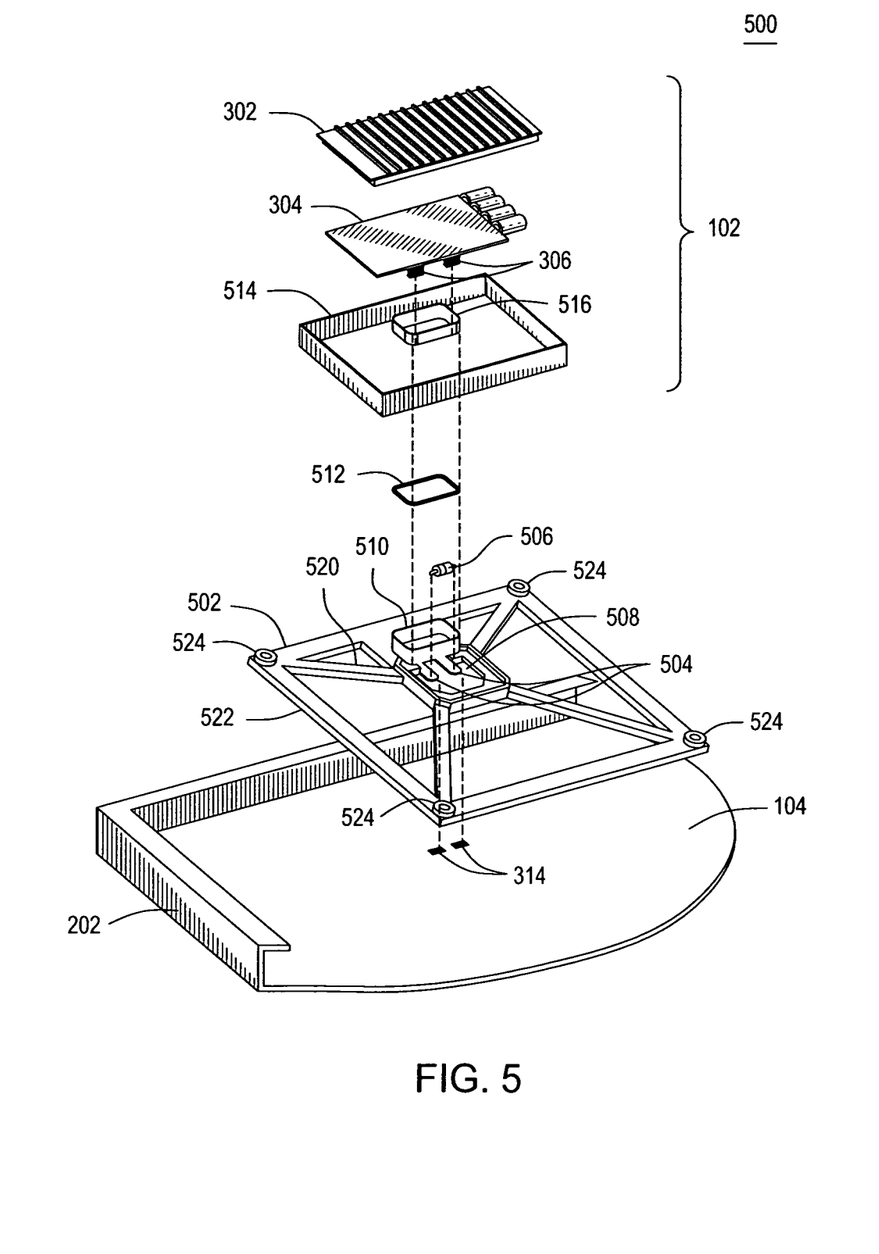
FIG. 5 is an exploded, close-up view of an alternative assembly for mounting an inverter to a PV module in accordance with one or more embodiments of the present invention.

FIG. 5 is an exploded, close-up view of an alternative assembly 500 for mounting an inverter 102 to a PV module 104 in accordance with one or more embodiments of the present invention. Within the assembly 500, the universal connector assembly 110 may comprise a retaining base 502 having an X-shaped support 520 contained within a rectangular or oval perimeter 522. The retaining base 502 is adhered to the rear face of the PV module 104 by an adhesive such as glue, VHB™ tape, or similar substance. In some embodiments, the entire retaining base 502, including the X-shaped support 520 and the perimeter 522, may be adhered to the PV module 104; alternatively, one or more portions of the retaining base 502, such as "feet" 524 located at corners of the retaining base perimeter 522, may be adhered to the PV module 104, to allow air circulation between the retaining base 502 and the PV module 104. The retaining base 502 may be constructed from any rigid insulating material, such as dielectric plastic and the like, and is functionally analogous to the retaining ring 316 for mounting the inverter 102 proximate the PV module 104.

The DC contacts 314 of the PV module 104 are coupled to conductive leads 504 of the retaining base 502. In some embodiments, the retaining base 502 may comprise two conductive leads 504 formed of a conductive material (e.g., aluminum, copper, or the like) that are coupled to the DC contacts 314 by welding, soldering, or similar method; alternatively, the conductive leads 504 may be coupled to the DC contacts 314 by a quick-connect method utilizing a resilient contact, such as a spring-connector mechanism. An optional diode 506 may be coupled between the conductive leads 504 by a method such as welding, soldering, quick-connect method, or similar method.

The retaining base 502 defines a shallow well 508 at the center of the X-shaped support 520, within which the conductive leads 504 reside. The well 508, including the conductive leads 504 coupled to the DC contacts 314 and optionally the diode 506, may be encapsulated by a potting material, such as polyurethane, silicon, or similar substance having limited moisture absorption properties, for sealing and protecting the electrical connections between the DC contacts 314 and the conductive leads 504 from environmental factors and foreign matter.

The retaining base 502 further comprises a retaining flange 510 for coupling to the inverter 102. The inverter 102 comprises a casing 514, analogous to the casing 308, where the casing 514 comprises an aperture rimmed by a flange extending towards the interior of the casing 514. The flange is generally part of the form factor of the casing 514 although may, in some embodiments, be coupled to the casing 514. The casing flange provides a coupling surface 516 of a size and shape for mating to the retaining flange 510 to secure the casing 514 to the retaining base 502. In some embodiments, the coupling surface 516 may be secured to the retaining flange 514 by a detachable mechanical method, such as one or more of snap features, clips, screws, rivets and the like; additionally or alternatively, the coupling surface 516 may be permanently secured to the retaining flange 514, for example by bonding adhesives. An O-ring 512 may be utilized to provide an additional environmental seal and may be secured by an adhesive, such as a silicone adhesive or a similar epoxy.

The casing cover 302 encloses the inverter board 304 within the casing 514 and may be secured to the casing 514 by one or more of screws, bolts, bonding adhesives, snap features, clips, or similar mechanical means.

In one or more alternative embodiments, a DC junction box, such as the DC junction box 404, may be removeably coupled to the retaining base 502/retaining flange 510 by a mechanical means, such as one or more of snap features, clips, screws, rivets and the like, and/or may be permanently adhered to the retaining base 502 by means such as epoxy, bonding, and the like. In some other embodiments, the DC junction box may be coupled between the inverter 102 and the PV module 104.

Figure 6A:
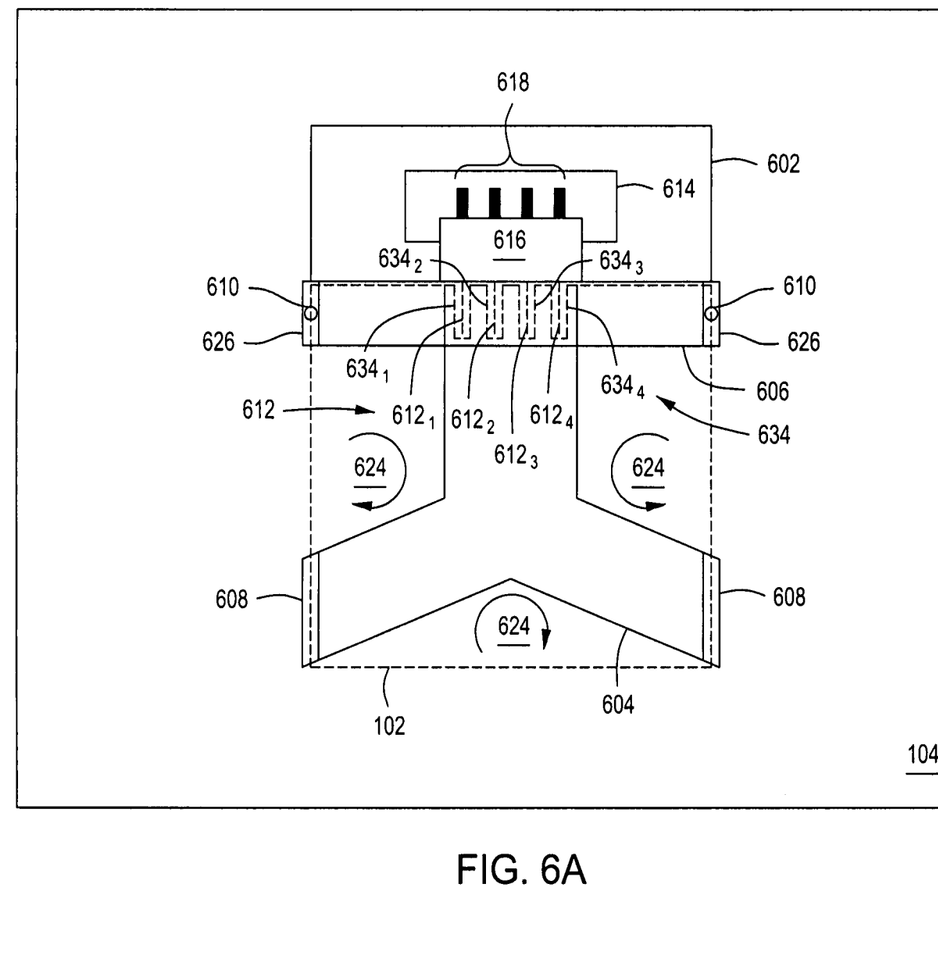
FIG. 6 depicts a plurality of perspective views of another alternative assembly for mounting an inverter to a PV module in accordance with one or more embodiments of the present invention.
Figure 6B:
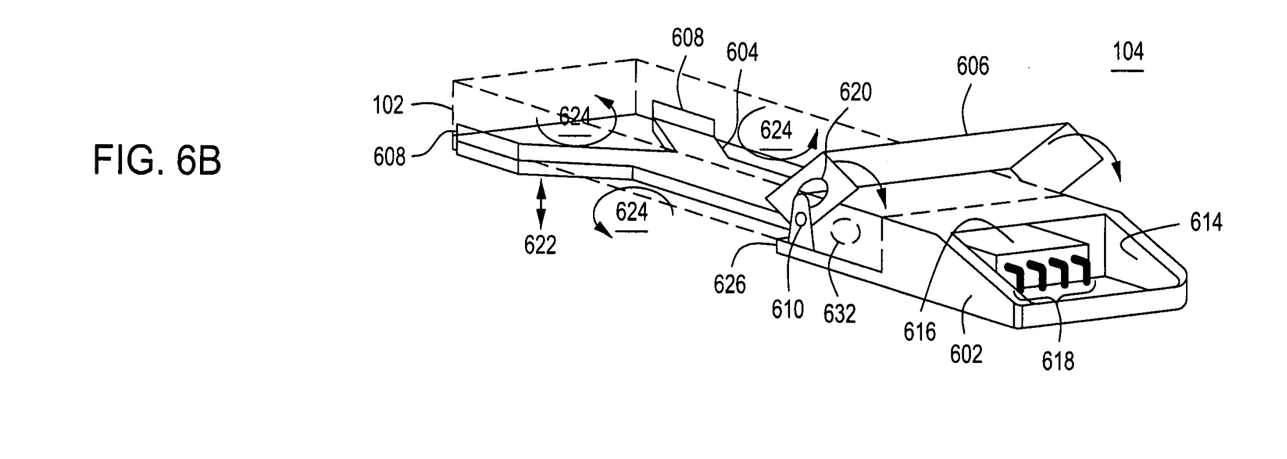
Figure 6C:
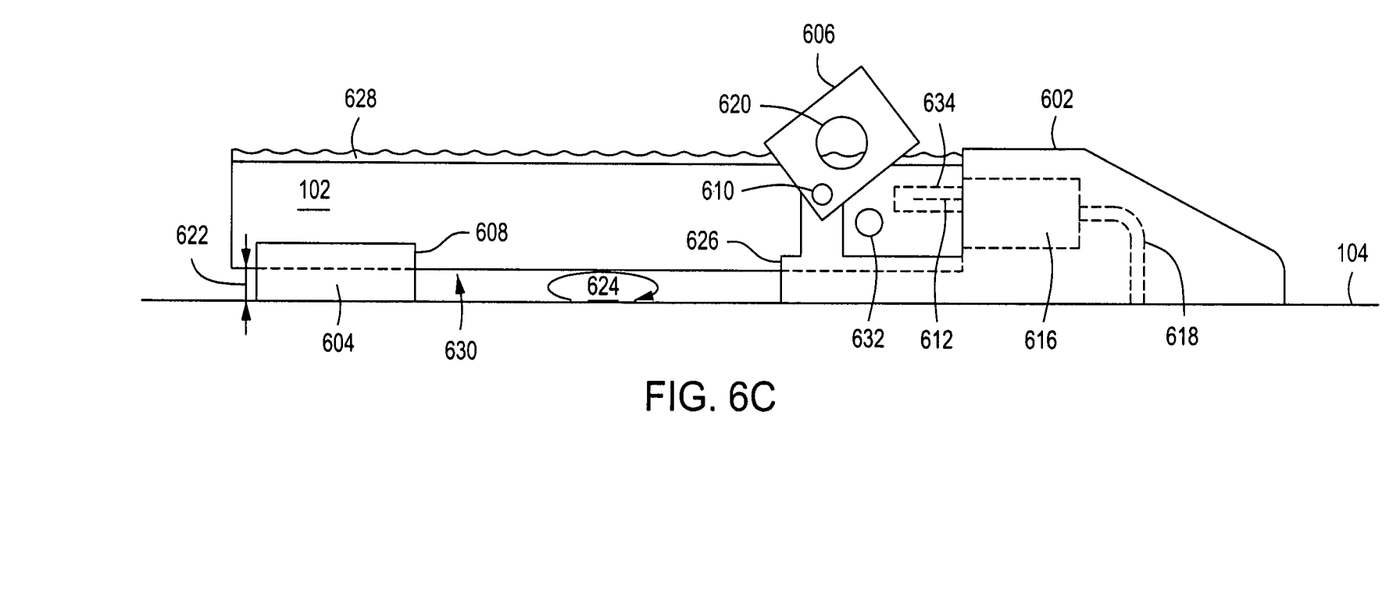

FIG. 6 depicts a plurality of perspective views of another alternative assembly 600 for mounting an inverter 102 to a PV module 104 in accordance with one or more embodiments of the present invention. In one or more alternative embodiments, the assembly 600 may mount a DC junction box or a DC/DC converter to the PV module 104. FIGS. 6A, 6B, and 6C provide an overhead perspective view, a side-angled perspective view, and a side perspective view, respectively, of the assembly 600.

In some embodiments, such as the embodiment depicted in FIG. 6, the universal connector assembly 110 comprises a connector housing 602 coupled to a base 604, each formed of a rigid insulating material, such as dielectric plastic or the like. The connector housing 602 is generally a rectangular shape having a width on the order of the inverter width, and is mounted on the rear face of the PV module 104 for mechanically as well as electrically coupling the inverter 102 to the PV module 104. The connector housing 602 generally has a height such that the inverter 102, once coupled to connector housing 602, is generally flush with the top of the connector housing 602.

The connector housing 602 is adhered to the rear face of the PV module 104 by any of the methods previously described such that PV module DC contacts 618 are exposed within a well 614 defined by the connector housing 602. The PV module DC contacts 618 generally comprise four foil or ribbon contacts extending from the rear face of the PV module 104 for providing DC current produced by the PV module 104. The well 614 exposes the PV module DC contacts 618 subsequent to the connector housing 602 being adhered to the PV module 104, thereby allowing the PV module DC contacts 618 be coupled to a DC connection assembly 616 of the connector housing 602. The PV module DC contacts 618 may be soldered, welded, clamped, screwed, and/or similarly coupled to the DC connection assembly 616 such that the PV module DC contacts 618 maintain electrical connectivity with the DC connection assembly 616. The well 614 may subsequently be sealed by a cover and/or encapsulated with a non-conductive potting material having limited moisture absorption properties, such as silicone, polyurethane, or the like, for protecting the electrical connections between the PV model 104 and the DC connection assembly 616 from environmental factors and foreign matter.

The DC connection assembly 616 comprises output connectors $612_1$, $612_2$, $612_3$, and $612_4$ (collectively "output connectors 612") that mate with inverter connectors $634_1$, $634_2$, $634_3$, and $634_4$ (collectively "inverter connectors 634"), respectively; in some alternative embodiments, fewer or more connectors may be utilized. The output connectors 612 couple DC power (i.e., DC current) generated by the PV module 104 to the inverter 102; additionally, in some embodiments, the output connectors 612 couple a unique PV module identifier to the inverter 102, as described in more detail with respect to FIG. 7.

Generally, the output connectors 612 and the inverter connectors 634 are pin-type connectors and socket-type connectors, respectively. In some embodiments, the output connectors 612 extend horizontally, with respect to the PV module face, from a vertical edge of the connector housing 602 along which the inverter 102 will be mounted, while the inverter connectors 634 are disposed along a side of the inverter 102 for mating with the output connectors 612. In one or more alternative embodiments, the output connectors 612 and/or the inverter connectors 634 may be other types of compatible connectors, such as socket, spring, leaf, or the like. Additionally or alternatively, the output connectors 612 and/or the inverter connectors 634 may be positioned differently on the universal connector assembly 110 and inverter 102.

The connector housing 602 may comprise flanges 626, for example, horizontally disposed from each side of the connector housing 602, for aligning the inverter 102 with the universal connector assembly 110 during insertion and for subsequently supporting the mounted inverter 102.

The base 604 generally has an inverted Y-shape with respect to the connector housing 602, although different shapes may be utilized, and is adhered to the rear face of the PV module 104 analogous to the connector housing 602. The base 604 is of a length, width, and thickness for supporting the inverter 102 at a spacing 622 from the PV module face, while simultaneously exposing at least a portion of the inverter 102 facing the PV module 104 and maintaining a minimum footprint on the face of the PV module 104. In some embodiments, the base 604 may comprise "feet" along the outer edges of the prongs of the Y-shape that are adhered to the PV module 104; alternatively, one or more other portions of the base 604, or the entire base 604, may be adhered to the PV module face. The spacing 622, as well as the shape of the base 604, ensure an airflow 624 may be circulated between the inverter 102 and the PV module 104 for maintaining a suitable thermal profile across the PV module cells as well as the inverter 102.

The outer edges of the base 604 may comprise flanges 608, disposed vertically with respect to the PV module face, for aligning the inverter 102 with the universal connector assembly 110 during insertion and for subsequently supporting the mounted inverter 102.

In some embodiments, the universal connector assembly 110 may further comprise a safety latch 606 in the form of an elongated U-shaped bar or bracket, for example, that pivots about hinges 610 for securing the mounted inverter 102. In some embodiments, the safety latch 606 may be hinged to the flanges 626 and pivot toward the connector housing 602 when moved from an open to a closed position to secure the inverter 102; alternatively, the safety latch 606 may be hinged to the body of the connector housing 602 and pivot away from the connector housing 602 when moved from open to closed to secure the inverter 102. The latch 602 may comprise one or more fasteners, such as a lock, clasp, hook, snap features, or the like, for locking the latch 602 in place once it is closed. Additionally, the latch 602 may comprise a puller/ejector mechanism for tightly coupling the inverter 102 to the universal connector assembly 110 during insertion and for ejecting the inverter 102 from the universal connector assembly 110 during removal.

The safety latch 606 comprises an orifice 620 along one side which, when the safety latch 606 is in a closed position, exposes an output power connector 632 of the inverter 102, i.e., a connector for coupling output power from the inverter 102. When the inverter 102 is mounted to the universal connector assembly with the safety latch 606 closed, the inverter output power must be coupled through the orifice 620, thereby requiring the inverter output power to be disconnected prior to removing the inverter 102 from the universal connector assembly 110 and preventing any shock hazard during inverter removal. In some embodiments, electrical connectivity between the inverter 102 and the DC connection assembly 616 may not be complete until the safety latch 606 is in the closed position; i.e., closing the safety latch 606 activates the puller mechanism to tightly couple the inverter connectors 634 to the output connectors 612 for completing the electrical connection.

In some embodiments, the inverter 102 comprises a heat sink 628 having a plurality of comb-like structures, external ribs, fins, or the like, for dissipating heat generated by the inverter 102. The heat sink 628 may be formed from any rigid, thermally conducting material, such as plastic, metal, or the like; in some embodiments, the heat sink 628 may be formed from black anodized metal, such as black anodized aluminum, for improved heat dissipation. The heat sink 628 may be attached to the inverter 102 by one or more of screws, bolts, bonding adhesives, snap features, clips, or similar mechanical means; alternatively, the heat sink 628 may be part of the inverter form factor.

The inverter 102 may further comprise an inverter base 630 having a reflective surface for facing the PV module 104 to reflect heat radiated by the PV module cells. The reflective surface may be formed from a polished stainless steel, reflective glass, or similar shiny material, and may be adhered to the inverter 102 or part of the inverter form factor.

The universal connector assembly 110 and/or the inverter 102 may be adapted for utilizing any of a plurality of possible insertion techniques for inserting the inverter 102 into the universal connector assembly 110 (i.e., for coupling the inverter 102 to the universal connector assembly 110). Such techniques include horizontally sliding the inverter 102 along the base 604, for example utilizing a guiding track to properly align the inverter connectors 634 with the output connectors 612; positioning the inverter 102 at an angle with respect to the universal connector assembly 110 to marry the inverter connectors 634 and the output connectors 612, and subsequently pivoting the inverter 102 downward toward the base 604 to secure the inverter 102 to the universal connector assembly 110; or, in some alternative embodiments where the output connectors 612 are disposed along a horizontal face of the connector housing 602, vertically aligning the inverter 102 with the universal connector assembly 110 and pressing the inverter 102 downward toward the base 604 to secure the inverter 102 to the universal connector assembly 110. Such techniques are described in more detail with respect to FIGS. 8, 9, and 10.

Once coupled to the universal connector assembly 110, the inverter 102 may be secured by one or more mechanical means in addition to or in place of those previously described, such as snap-fit, latching clips, screws, straps, or the like.

Figure 7:
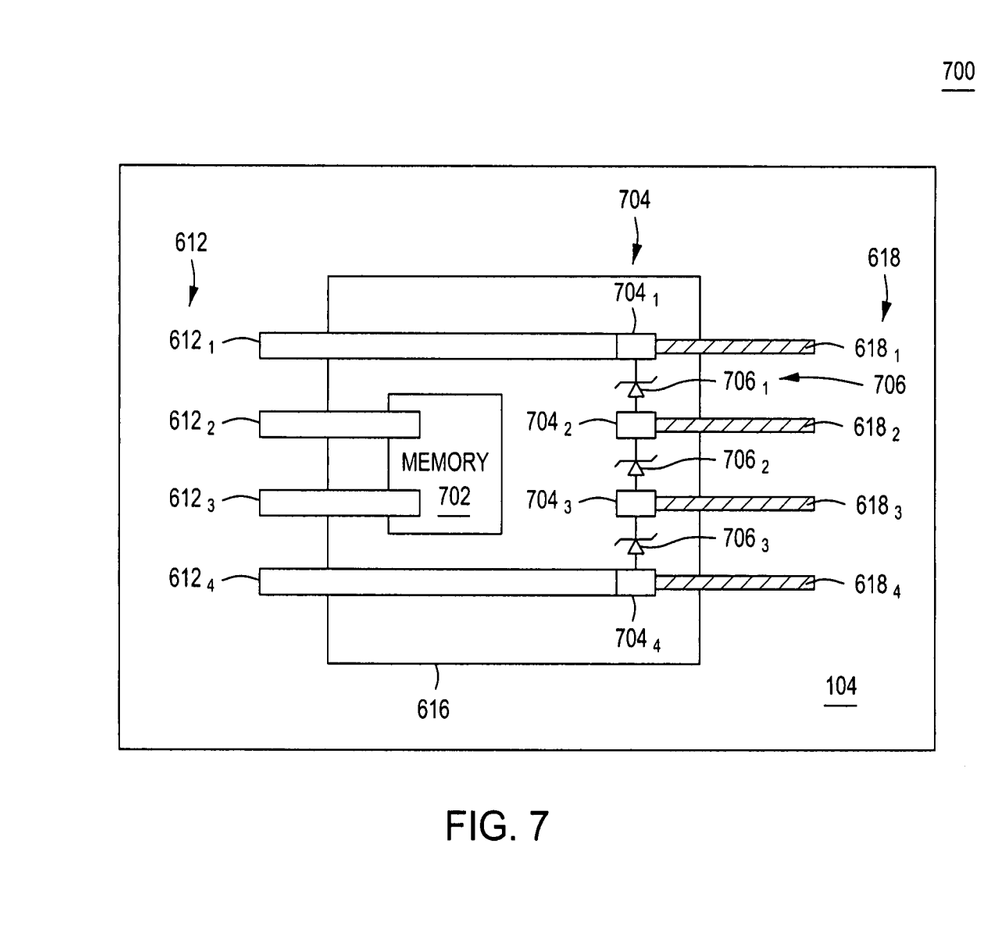
FIG. 7 is a schematic diagram of a DC connection assembly in accordance with one or more embodiments of the present invention.

FIG. 7 is a schematic diagram of a DC connection assembly 616 in accordance with one or more embodiments of the present invention. The DC connection assembly 616 comprises connectors $704_1$, $704_2$, $704_3$, $704_4$ (collectively connectors 704) for electrically coupling to the PV module DC connectors $618_1$, $618_2$, $618_3$, and $618_4$ (collectively PV module DC connectors 618), respectively. The connectors 704 may be any type of connector suitable for being electrically coupled to the PV module DC connectors 618, such as pin-out slots, sockets, clamps, leaf springs, or the like, and may be soldered, screwed, clamped, or similarly coupled to the PV module DC connectors 618.

The connectors $704_1$ and $704_4$ are further electrically coupled to output connectors $612_1$ and $612_4$, respectively, for providing the DC current output from the PV module 104 to the inverter 102.

The DC connection assembly 616 comprises diodes $706_1$, $706_2$, and $706_3$ (collectively diodes 706) coupled between connectors $704_1/704_2$, $704_2/704_3$, and $704_3/704_4$, respectively, for providing a bypass function to prevent reverse-current damage to the PV cells of the PV module 104. Although three diodes 706 are shown in FIG. 7, a different number of diodes may be utilized based on the number of PV module DC connectors 704. In some alternative embodiments, active semiconductor components, other than diodes, may be utilized to provide the bypass function.

In addition to providing a means for electrically coupling to the PV module DC connectors 618, the DC connection assembly 616 also provides a means for individually identifying each PV module 104. The DC connection assembly 616 comprises a memory 702 for storing a unique PV module identification (ID) number, such as a serial number. In some embodiments, the memory 702 is a static two-conductor memory that is pre-programmed with the PV module ID; in some alternative embodiments, other types of memory structures may be utilized for storing the PV module ID. The memory 702 is coupled to output connectors $612_2$ and $612_3$ for providing the PV module ID to the inverter 102. The inverter 102 may then store and/or communicate the PV module ID to a centralized system for tracking the corresponding PV module 104. Use of such a PV module ID is further described in commonly assigned U.S. Patent Application Ser. No. 61/270,809, entitled "Method and System for Locating Stolen Solar Power System Components" and filed Jul. 14, 2009, which is herein incorporated in its entirety by reference.

Figure 8:
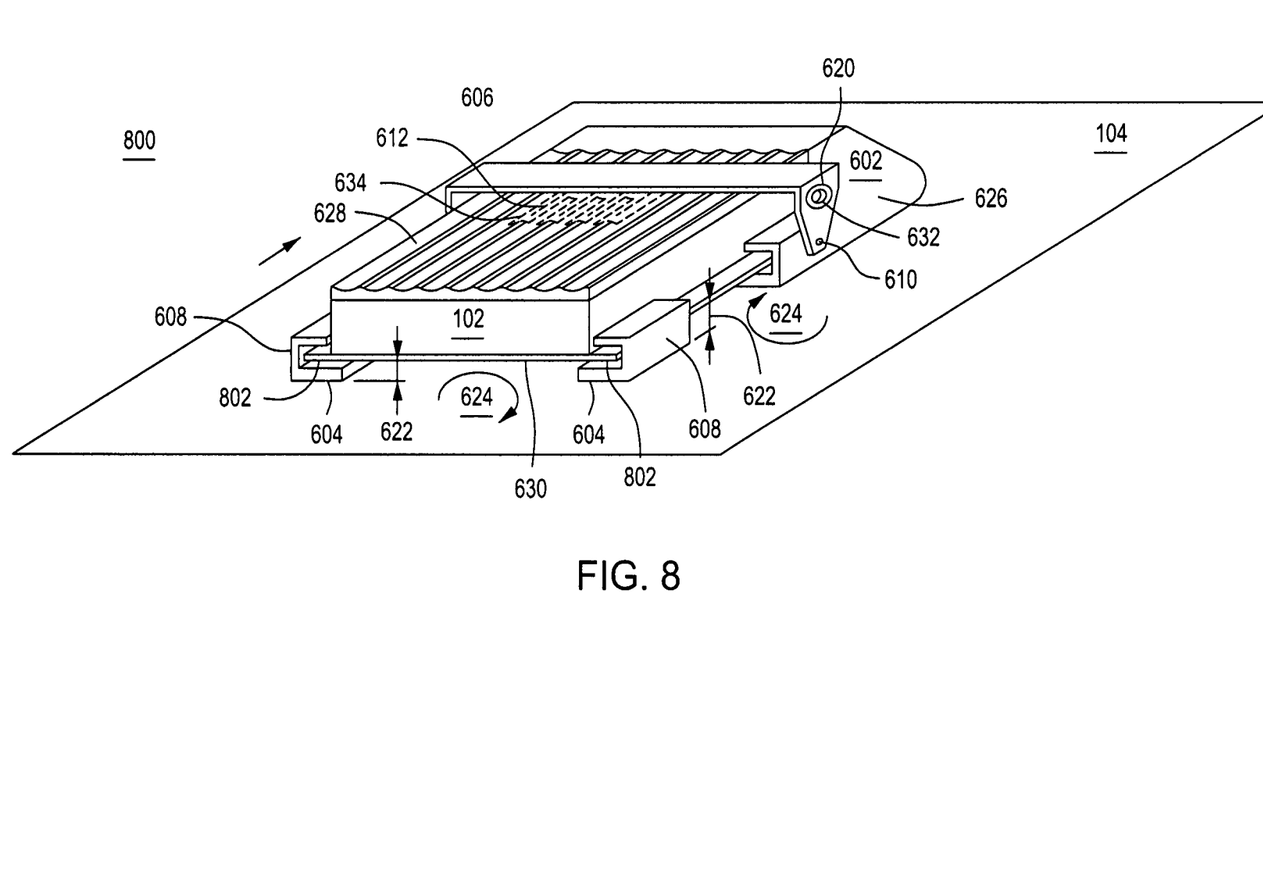
FIG. 8 is a side-angled perspective view depicting a horizontal sliding technique for coupling an inverter to a universal connector assembly in accordance with one or more embodiments of the present invention.

FIG. 8 is a side-angled perspective view depicting a horizontal sliding technique for coupling an inverter 102 to a universal connector assembly 110 in accordance with one or more embodiments of the present invention. A connector housing 602 and a base 604 of the universal connector assembly 110 are adhered to a PV module 104 as previously described.

The base 630 protrudes due to one or more flanges 802 extending horizontally from each side of the inverter 102 along the length of the inverter 102. In some embodiments, such as the embodiment depicted in FIG. 8, flanges 608 and 626 each have a form of an inverted L-shape such that the flanges 802 may be inserted into the flanges 608 and 626 and the inverter 102 then horizontally slid toward the connector housing 602. The flanges 608 and 626 act as a track for guiding the inverter 102 during insertion into the universal connection assembly to ensure that the output connectors 612 and the inverter connectors 634 are properly aligned prior to contact. In one or more alternative embodiments, the inverter 102 and/or the universal connector assembly 110 may employ additional and/or alternative flanges, flange shapes, and/or similar guide/track structures to ensure proper alignment when the inverter 102 is inserted into the universal connector assembly 110 by the horizontal sliding technique.

In some embodiments, the safety latch 606 may comprise a puller/ejector that may be engaged when the inverter 102 is coupled to/removed from the universal connector assembly 110 by the horizontal sliding technique. In such embodiments, the safety latch 606 may be moved from an open position to a closed position after the inverter 102 is inserted into the universal connector assembly 110 as previously described. As the safety latch 606 is moved to the closed position, the puller mechanism is engaged and draws the inverter 102 toward the connector housing 602 to tightly couple the inverter connectors 634 to the output connectors 612. Additionally, while the safety latch 606 is in the closed position, the orifice 620 exposes the connector 632. The orifice 620, which may alternatively be referred to as a power output connector interface of the safety latch 606, ensures that the inverter 102 cannot be removed from the universal connector assembly 110 while having an output coupled to the connector 632.

When the inverter 102 is to be removed from the universal connector assembly 110, the safety latch 606 is moved from the closed to the open position, engaging the ejector mechanism to eject the inverter 102 from the universal connector assembly 110. For example, the ejector may release the connection between the inverter connectors 634 and the output connectors 612 so that the inverter 102 may be horizontally slide away from the connector housing 602 and removed from the universal connector assembly 110.

While the inverter 102 is coupled to the universal connector assembly 110, the inverter 102 is retained at the spacing 622 from the face of the PV module 104, thereby ensuring the airflow 624 can circulate between the inverter 102 and the PV module 104 to maintain a suitable thermal profile across the PM module PV cells as well as the inverter 102.

Figure 9:
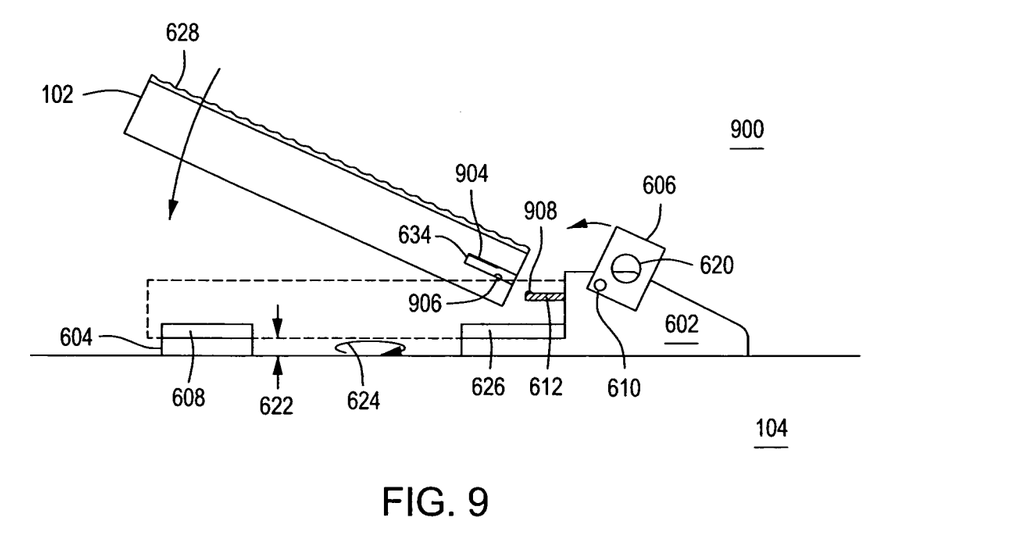
FIG. 9 is a side perspective view depicting a pivoting technique for coupling an inverter to a universal connector assembly in accordance with one or more embodiments of the present invention.

FIG. 9 is a side perspective view depicting a pivoting technique for coupling an inverter 102 to a universal connector assembly 110 in accordance with one or more embodiments of the present invention. A connector housing 602 and a base 604 of the universal connector assembly 110 are adhered to a PV module 104 as previously described. In some embodiments, such as the embodiment depicted in FIG. 9, the output connectors 612 are pin-type connectors where the free end of each pin (i.e., the end of the pin not coupled to the connector housing 602) comprises a protrusion 908, such as a bulbous shape. In such embodiments, the inverter connectors 634 are socket-type connectors or receptacles for mating with the output connectors 612. Each inverter connector 634 comprises a conductive pad 904 opposing a detent 906. The inverter 102 is inserted into the universal connector assembly 110 at an angle such that the output connectors 612 are received into the inverter connectors 634. The inverter 102 is subsequently rotated toward the base 604, utilizing a cam action to cause the detent 906 to apply and maintain pressure against the output connectors 612 for connectively coupling the protrusion 908 to the conductive pad 904. In one or more alternative embodiments, other types of cam action may be utilized for connectively coupling the inverter connectors 634 to the output connectors 612.

Once inserted into the universal connector assembly 110, the safety latch 606, coupled to connector housing 602 by hinges 610, may be rotated toward the inverter 102 to secure the inverter 102 in place and expose the connector 632 through the orifice 620 while the safety latch 606 is in the closed position, thereby ensuring that the inverter 102 cannot be removed from the universal connector assembly 110 while having an output coupled to the connector 632. Additionally, the safety latch 606 may comprise a puller/ejector for tightly coupling the inverter 102 to the universal connector assembly 110 when moved from the open to the closed position and ejecting the inverter 102 from the universal connector assembly 110 when moved from the closed to the open position, as previously described.

The universal connector assembly 110 retains the inverter 102 at the spacing 622 from the face of the PV module 104, thereby ensuring the airflow 624 may circulate between the inverter 102 and the PV module 104 to maintain a suitable thermal profile across the PM module PV cells as well as the inverter 102. Additionally, the heat sink 628 dissipates heat generated by the inverter 102.

Figure 10:
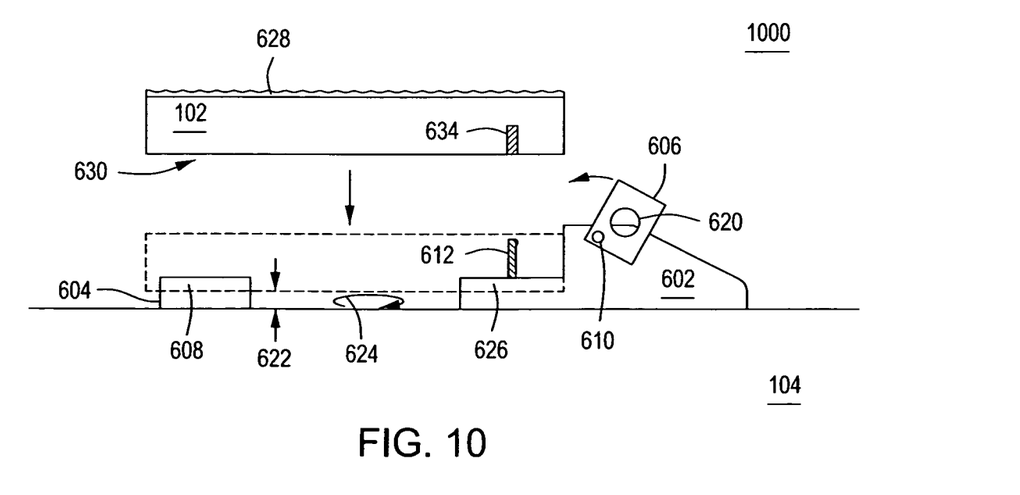
FIG. 10 is a side perspective view depicting a top insert technique for coupling an inverter to a universal connector assembly in accordance with one or more embodiments of the present invention.

FIG. 10 is a side perspective view depicting a top insert technique for coupling an inverter 102 to a universal connector assembly 110 in accordance with one or more embodiments of the present invention. A connector housing 602 and a base 604 of the universal connector assembly 110 are adhered to a PV module 104 as previously described. In some embodiments, such as the embodiment depicted in FIG. 10, the output connectors 612 are vertically disposed with respect to the PV module 104 (i.e., perpendicular to the PV module face). The inverter connectors 634 are disposed on the inverter base 630 such that the inverter 102 may be aligned with the universal connector assembly 110 from an overhead position and pushed downward toward the base 604 to electrically and mechanically couple the inverter 102 to the universal connector assembly 110.

As the inverter 102 is pressed toward the base 604, one or more mechanical means, such as snap-fit, latching clips, screws, straps, or the like, may be utilized to secure the inverter 102 to the universal connector assembly 110. Once inserted into the universal connector assembly 110, the safety latch 606, coupled to connector housing 602 by hinges 610, may be rotated toward the inverter 102 to secure the inverter 102 in place and expose the connector 632 through the orifice 620 while the safety latch 606 is in the closed position, thereby ensuring that the inverter 102 cannot be removed from the universal connector assembly 110 while having an output coupled to the connector 632. Additionally, the safety latch 606 may comprise a puller/ejector for tightly coupling the inverter 102 to the universal connector assembly 110 when moved from the open to the closed position and ejecting the inverter 102 from the universal connector assembly 110 when moved from the closed to the open position, as previously described The universal connector assembly 110 retains the inverter 102 at the spacing 622 from the face of the PV module 104, thereby ensuring the airflow 624 between the inverter 102 and the PV module 102 for maintaining a suitable thermal profile across the PM module PV cells as well as the inverter 102. Additionally, the heat sink 628 dissipates heat generated by the inverter 102.

The universal connector assembly 110 presents a universal interface for mechanically and electrically coupling a plurality of types of power modules, such as a DC junction box, a DC/DC converter, or a DC/AC inverter, to a PV module, thereby making possible a standardization such that any compatible power module may be efficiently coupled to the PV module in a factory and/or field environment. Additionally, the universal connector assembly 110 couples power from the PV module 104 to the power element by a minimum number of connection points, i.e., one connection point between the PV module DC connectors 618 and the DC connection assembly 616, and one connection point between the DC connection assembly 616 and the power module, for optimal reliability.

While the foregoing is directed to embodiments of the present invention, other and further embodiments of the invention may be devised without departing from the basic scope thereof, and the scope thereof is determined by the claims that follow.

The invention claimed is:

1. Apparatus for coupling power generated by a photovoltaic (PV) module to an output, comprising:
 a universal connector assembly, comprising:
  a connector housing, adapted for coupling to the PV module, comprising a DC connection assembly for coupling power from the PV module to a power module via a first plurality of connectors; and
  a base for supporting the power module spaced apart from the PV module in a manner that exposes at least a portion of the power module facing the PV module to the air and prevents air from being trapped between the power module and the PV module, wherein the connector housing defines a well that exposes at least two PV module contacts subsequent to the connector housing being adhered to the PV module;

a safety latch coupled to the connector housing that, when moved to a closed positioned, secures the power module and exposes an interface of the power module to couple power from the power module.

2. The apparatus of claim 1, wherein the DC connection assembly comprises a memory for storing an identifier for the PV module.

3. The apparatus of claim 2, wherein the first plurality of connectors comprises (i) at least two DC connectors for coupling to at least two PV module contacts, and (ii) at least one bypass component coupled between the at least two DC connectors.

4. The apparatus of claim 1, wherein the well further includes exposing at least two DC connectors.

5. The apparatus of claim 4, wherein the well, subsequent to the at least two DC connectors being coupled to the at least two PV module contacts, is at least one of encapsulated by a potting material or sealed by a cover.

6. The apparatus of claim 1, wherein at least one of the connector housing or the base comprises at least one flange for aligning the power module with the universal connector assembly when coupling the power module to the universal connector assembly.

7. The apparatus of claim 1, wherein the first plurality of connectors is adapted for coupling the power module to the universal connector assembly by a horizontal sliding technique, a pivot technique, or a top insert technique.

8. The apparatus of claim 1, wherein the first plurality of connectors is adapted for being coupled to a second plurality of connectors of the power module by a cam action.

9. The apparatus of claim 1, wherein the base is substantially Y-shaped.

10. The apparatus of claim 1, wherein the power module is interchangeable and comprising: a DC junction box, a DC/DC converter, or a DC/AC inverter.

11. The apparatus of claim 1, wherein the power module comprises a second plurality of connectors adapted for being coupled to the first plurality of connectors by a horizontal sliding technique, a pivot technique, or a top insert technique.

12. The apparatus of claim 1, wherein the power module comprises a second plurality of connectors adapted for being electrically coupled to the first plurality of connectors by a cam action.

13. The apparatus of claim 1, wherein an area of the power module surface is reflective for reflecting heat generated by the PV module.

14. The apparatus of claim 1, wherein the power module comprises a heat sink for dissipating heat generated by the power module.

15. The apparatus of claim 14, wherein the heat sink is formed from black anodized metal.

16. The apparatus of claim 1, wherein the universal connector assembly comprises at least a first flange and the power module comprises at least a second flange, the at least a first flange adapted for receiving the at least a second flange for aligning the power module with the universal connector assembly when coupling the power module to the universal connector assembly.

17. Apparatus for coupling a power module to a photovoltaic (PV) module, comprising:
a universal connector assembly, comprising:
a connector housing, adapted for coupling to the PV module, for coupling power from the PV module to the power module;
a base, extending from the connector housing, for supporting the power module; and
a safety latch, coupled to the connector housing, for retaining the power module when the power module is coupled to the universal connector assembly and comprising a power output connector interface for ensuring the power module cannot be removed from the universal connector assembly while having a power output connector connected, wherein closing the safety latch secures the power module into position and exposes an interface of the power module for providing output power from the power module.

18. The apparatus of claim 17, wherein the safety latch comprises a puller for drawing the power module toward the universal connector assembly when the safety latch is moved from an open to a closed position.

19. The apparatus of claim 17, wherein the safety latch comprises an ejector for ejecting the power module from the universal connector assembly when the safety latch is moved from a closed position to an open position.

* * * * *